United States Patent
Le Gallo-Bourdeau et al.

(10) Patent No.: US 12,417,124 B2
(45) Date of Patent: Sep. 16, 2025

(54) PROGRAMMING ELEMENTS ONTO A COMPUTATIONAL MEMORY

(71) Applicant: International Business Machines Corporation, Armonk, NY (US)

(72) Inventors: Manuel Le Gallo-Bourdeau, Horgen (CH); Abu Sebastian, Adliswil (CH); Frédéric Elias Odermatt, Adligenswil (CH); Julian Buechel, Zürich (CH)

(73) Assignee: International Business Machines Corporation, Armonk, NY (US)

( * ) Notice: Subject to any disclaimer, the term of this patent is extended or adjusted under 35 U.S.C. 154(b) by 848 days.

(21) Appl. No.: 17/656,163

(22) Filed: Mar. 23, 2022

(65) Prior Publication Data

US 2023/0305893 A1    Sep. 28, 2023

(51) Int. Cl.
G06F 9/46    (2006.01)
G06F 9/50    (2006.01)

(52) U.S. Cl.
CPC ................... *G06F 9/5027* (2013.01)

(58) Field of Classification Search
CPC .................................................. G06F 9/5027
See application file for complete search history.

(56) References Cited

U.S. PATENT DOCUMENTS

| | | | |
|---|---|---|---|
| 8,441,847 B2 | 5/2013 | Eleftheriou et al. | |
| 2019/0171450 A1 | 6/2019 | Werner et al. | |
| 2020/0279012 A1 | 9/2020 | Khaddam-Aljameh et al. | |
| 2020/0341503 A1* | 10/2020 | Rios Ocampo | G06E 1/045 |
| 2023/0195457 A1* | 6/2023 | Kalantzis | G06F 9/30036 712/7 |

FOREIGN PATENT DOCUMENTS

WO    2021158861 A1    8/2021

OTHER PUBLICATIONS

Biswas et al., "Conv-RAM: An Energy-Efficient SRAM with Embedded Convolution Computation for Low-Power CNN-Based Machine Learning Applications," 2018 IEEE International Solid-State Circuits Conference, pp. 488-490.
Burr et al., "Neuromorphic computing using non volatile memory," ISSN: (print) 2374-6149 (Online) Journal homepage: http://tandfonline.com/loi/tapx20, Dec. 4, 2016, 37 pgs.

(Continued)

*Primary Examiner* — Gregory A Kessler
(74) *Attorney, Agent, or Firm* — Randy Tejeda (57) ABSTRACT

Provided is a method, device, and computer program product for programming a set of first elements onto a computational memory. The computational memory allows for performing a computation task from a set of second elements that encode the set of first elements in the computational memory, respectively. The method includes performing the computation task by the computational memory using the set of second elements and adapting at least part of the set of second elements in the computational memory based on a measured result of the computation task, until the measured result of the computation task fulfils an accuracy condition.

20 Claims, 5 Drawing Sheets

(56) References Cited

OTHER PUBLICATIONS

Huangfu et al., "MatrixMap: Programming Abstraction and Implementation of Matrix Computation for Big Data Analytics," https://www.aimsciences.org/article/doi/10.3934/bdia.2016015, Big Data and Information Analytics, vol. 1, No. 4, Oct. 2016, pp. 349-376.
Khaddam-Aljameh et al., "A Multi-Memristive Unit-Cell Array with Diagonal Interconnects for In-Memory Computing," https://ieeexplore.ieee.org/document/9426955, IEEE Transactions on Circuits and Systems II: Express Briefs, May 10, 2021, 4 pgs.
Khaddam-Aljameh et al., "Hermes Core—A 14nm CMOS and PCM-based In-Memory Compute Core using an array of 300ps/LSB Linearized CCO-based ADCs and local digital processing," JFS2-5, 2021 Symposium on VLSI Circuits Digest of Technical Papers, © 2021, 2 pgs.
Lee et al., "Matrix Mapping on Crossbar Memory Arrays with Resistive Interconnects and Its Use in In-Memory Compression of Biosignals," https://www.mdpi.com/2072-666X/10/5/306/htm, Micromachines 2019, 10(5) Journal, May 7, 2019, 8 pgs.
Valavi et al., "A 64-Tile 2.4-Mb In-Memory-Computing CNN Accelerator Employing Charge-Domain Compute," IEEE Journal of Solid-State Circuits, © 2019, 11 pgs.
Xia et al., "Memristive crossbar arrays for brain-inspired computing," https://doi.org/10.1038/s41563-019-0291, Nature Materials, vol. 18, Apr. 2019, pp. 309-323.

* cited by examiner

PROGRAMMING ELEMENTS ONTO A COMPUTATIONAL MEMORY

BACKGROUND

The present disclosure relates to the field of digital computer systems, and more specifically, to programming elements onto a computational memory.

In-memory computing is a key non-Von Neumann approach being researched. A key element in this computing paradigm may be a high-density, low-power, variable state, programmable and non-volatile memory device. One example computational primitive is a matrix-vector multiplication. However, there is a need to further improve the performance of such computing.

SUMMARY

Embodiments of the present disclosure include a method, device, and computer program product for programming elements onto a computational memory.

In an embodiment, the method allows for programming a set of first elements onto a computational memory, the computational memory being configured for performing a computation task from a set of second elements that encode the set of first elements in the computational memory respectively. The method includes performing an iterative process comprising: performing the computation task by the computational memory using the set of second elements and adapting at least part of the set of second elements in the computational memory based on a measured result of the computation task, until the measured result of the computation task fulfills an accuracy condition.

In another embodiment, a computer program product comprising a computer-readable storage medium having computer-readable program code embodied therewith, the computer-readable program code configured to perform a method for programming a set of first elements onto a computational memory, the computational memory being configured for performing a computation task from a set of second elements that encode the set of first elements in the computational memory respectively. The method comprising: performing an iterative process comprising: performing the computation task by the computational memory using the set of second elements and adapting at least part of the set of second elements in the computational memory based on a measured result of the computation task, until the measured result of the computation task fulfills an accuracy condition.

In another embodiment, a device may include a computational memory configured for storing a set of second elements that encode a set of first elements and performing a computation task from the set of second elements, where the device is configured for executing an iterative process. The device may perform the computation task by the computational memory and adapt at least part of the set of second elements in the computational memory based on a measured result of the computation task, until the measured result fulfills an accuracy condition.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate to the field of digital computer systems and, more particularly, to programming elements onto a computational memory. While the present disclosure is not necessarily limited to such applications, various aspects of the disclosure may be appreciated through a discussion of various examples using this context.

The descriptions of the various embodiments of the present disclosure will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In-memory computing may be the technique of running computer calculations entirely in a computer memory. A computational memory may be a memory that enables the in-memory computing. The computational memory may use the physical properties of memory devices for both storing and performing calculations. The computational memory may be programmed so that the set of first elements may be encoded into the set of second elements respectively. The set of first elements may, for example, be numbers, and the set of second elements may be conductance values. The computational memory may be configured to perform calculations using the stored set of second elements. The computational memory may be configured to perform a computation task using the stored set of second elements. The computation task may, for example, be multiplication, matrix-vector multiplication, or other computation primitives that may be computed in-memory. The computational memory may, for example, receive an input, and perform the computation task using the input and the set of second elements. The computation task may involve more than one element of the set of second elements, and the measured result of the computation task may be obtained without reading back the second set of elements at individual basis, e.g., the measured result of the computation task may be obtained without reading back the unit-cell states at an individual unit-cell basis.

Thus, an accurate programming of elements onto the computational memory may be essential to achieve sufficient accuracy of the computation tasks. In particular, programming inaccuracy may directly translate to computational imprecision associated with a computation task such as the matrix-vector multiply operations. In addition, during computation, the memory content may not be read back or processed at the granularity of a single memory element. This may render the task of improving the accuracy of measurements a challenging task. The present disclosure may solve these issues by using a collective measurement derived from all second elements of the computational memory to compute the updates required for the individual second elements stored on the computational memory. For example, the computational memory may be repeatedly programmed with a set of second elements that represent the set of first elements until the result of the computation task fulfills the accuracy condition. Fulfilling the accuracy condition may indicate that the set of second elements provides a reliable and accurate representation of the set of first elements.

According to one embodiment, adapting the at least part of the set of second elements comprises: estimating the result of the computation task using the set of first elements; comparing the estimated result with the measured result; and using the comparison result for updating the set of second elements such that the difference between the estimated result and the measured result is minimized. For example, assume the computation task is the multiplication of a number A with two numbers B and C as follows A*B+A*C, wherein the numbers B and C are fixed numbers (e.g., B is 9 and C is 7), and A can be any other number that can be multiplied with B and C. In this case, the set of first elements comprise two elements which are B and C. The computational memory may be programed so as to store two second elements that represent B and C respectively. The computational memory may receive as input a number A and perform the computation task A*B+A*C. This embodiment may estimate the value of A*B+A*C and compare it with the result provided by the computational memory. For example, if A=6, the estimated result may be 6*9+6*7=96; however, the computed product may not be exactly 96 due to hardware limitations, e.g., the computed result may be 95. The comparison between the estimated and measured results may, for example, be the difference between them. If the difference does not fulfill the accuracy condition, e.g., the difference is not smaller than 0.5, the computational memory may be programmed again with one or both values that represent B=9 and C=7 in such a way that the difference between the estimated and measured results get smaller and smaller.

According to one embodiment, the computation task may be a matrix-vector multiplication (MVM). This primitive may be of particular interest as it forms the basis of several linear algebraic operations, and it is one of the most commonly used mathematical operations in science and engineering. A matrix is usually represented by a two-dimensional array of matrix elements and a vector by a one-dimensional array of vector elements. A matrix may be considered as array of vectors. In this example, the set of first elements may be elements of a target matrix $G_{tar}$. The computational memory may, for example, be referred to as an in-memory computing (IMC) based matrix-vector multiply engine. The computational memory may comprise a memory array for storing the set of second elements respectively. For example, the computational memory may comprise a memory array with a crossbar array structure comprising n row lines and m column lines (where n>1 and m>1 and n may or may not be equal to m) and electronic devices coupled between the row lines and the column lines at junctions formed by the row and column lines. The electronic devices may be programmed so as to incrementally change states of the electronic devices. Each electronic device may include a memristive device. Several types of memristive devices may be used, such as phase change memories (PCM) cells, resistive random-access memory (RRAM) cells, static random-access memory (SRAM) cells, or electro-chemical random-access memory (ECRAM) cells. In other variants, flash cells may be used. Programming the electronic devices may result in incrementally changing states of the electronic devices (e.g., change the electrical conductances of the electronic devices). The matrix-vector multiplication of the matrix $G_{tar}$ ($G_{tar} \in \mathbb{R}^{n \times m}$) and vector x ($x \in \mathbb{R}^n$) may be realized through the memory array by encoding each matrix element $G_{tarij}$ with the conductance value $G_{ij}$ of the corresponding memristive device of the memory array, wherein the multiplication of the matrix $G_{tar}$ and vector x may be performed by inputting voltages representing the vector values $x_i$ to the crossbar array and the resulting currents are indicative of the product of $G_{tar}$ and x. In this case, the set of second elements may be conductance values $G_{ij}$ of the matrix G. For example, by applying a voltage vector V as input on the rows and collecting the current flowing in each column $I_j$ the matrix-vector multiplication may be computed according to:

$$I_j = \sum_{k=1}^{n} G_{kj} V_k.$$

The present disclosure may provide accurate matrix vector multiplication operations despite the inherent stochasticity of switching behavior in memristive devices. By adapting the conductance values based on the accuracy of the computed product G. V, the present disclosure may solve the following issue. Programming the same device several times, in the same condition (or initial state) of programming pulse-width and amplitude, may result in various conductances due to the stochastic process of ionic migration during set/reset operation. That is, the target or desired matrix vector multiplication $G_{tar}$·x may not be accurately represented by the computed matrix vector multiplication: G·V.

At an initial state, the computational memory may comprise a matrix $G^0$ of conductance values. These conductance values of the matrix $G^0$ may be programmed in the computational memory using respective elements of a programming matrix $U^0$.

In one example, the iterative process may be implemented as a machine learning (ML) based approach. In each iteration t, the computational memory may store a matrix $G^{t-1}$ of conductance values. In each iteration t, a deviation $\Delta G$ between the target matrix $G_{tar}$ and the actual matrix $G^{t-1}$ may be estimated based on a predefined loss function, an update matrix $U^t \in \mathbb{R}^{n \times m}$ may be amended so that it brings the deviation $\Delta G$ close to zero, and the update matrix $U^t$ may be used to update the elements of the matrix $G^{t-1}$ to obtain matrix $G^t$ for a next iteration t+1. The update matrix $U^t$ may be referred to as a programming matrix that may be used to program the computational memory. The accuracy condition may require that all individual elements of the deviation $\Delta G$ are smaller than a threshold. The deviation $\Delta G$ may also be referred to herein as error matrix.

The loss function may, for example, be defined as follows. A set of B vectors $x^i \in \mathbb{R}^n$ (i$\in$ {1 . . . B}) may be provided and for which a matrix vector multiplication operation with a matrix $G_{tar}$ is to be performed. The target/desired result of the matrix vector multiplication operation for each vector $x^i$ may be $y_{tar}^i = G_{tar}^T x^i$ and the actual MVM result is $y^i = G^T V^i$, where $V^i$ is the $i^{th}$ voltage vector that represents the values of the vector $x^i$. A loss function may thus be defined as follows:

$$\mathcal{L}_G = \sum_{i=1}^B \frac{\|y_{tar}^i - y^i\|_2^2}{\|y_{tar}^i\|_2^2},$$

and the associated gradient may be defined as:

$$\nabla \mathcal{L}_G = \sum_{i=1}^B \nabla \mathcal{L}_{G^i}$$

where $$\nabla \mathcal{L}_{G^i} = \frac{-2}{\|y_{tar}^i\|_2^2} x^i (y_{tar}^i - y^i)^T.$$

The i-th gradient may be calculated by plugging the definition of $y^i$ into the loss function and applying derivation rules. The error matrix $\Delta G$ may, for example, be equal to the gradient $\nabla \mathcal{L}^G$, $\Delta G = \nabla \mathcal{L}_G$.

In one example, the iterative process may be implemented as a multivariate linear regression based approach so that in each iteration t, an estimate $\hat{G}$ of the actual matrix $G^{t-1}$ may be performed via multivariate linear regression, an update matrix $U^t \in \mathbb{R}^{n \times m}$ that brings the estimate $\hat{G}$ close to the target matrix $G_{tar}$ may be learnt, and the update matrix $U^t$ may be used to update the elements of the actual matrix $G^{t-1}$ to obtain matrix $G^t$ for a next iteration t+1. The accuracy condition may require that the estimate G is close to the target matrix $G_{tar}$ by a predefined shift value.

For example, a set of B vectors $x^i \in \mathbb{R}^n$ (i$\in$ {1 . . . B}) may be provided and for which a MVM operation with a matrix $G_{tar}$ is to be performed. The target/desired result of the MVM operation for each vector $x^i$ may be $y_{tar}^i = G_{tar}^T x^i$ and the actual MVM result is $y^i = G^T V^i$, where $V^i$ is the $i^{th}$ voltage vector that represents the values of the vector $x^i$. The set of output vectors $Y^{t+1}$ may be used to estimate a conductance matrix $\hat{G}$ as follows:

$$\hat{G} = (X^T X)^{-1} X^T Y$$

and an error matrix as follows:

$$\widehat{\Delta G} = G_{tar} - \hat{G}, \text{ where } X = \{x^1, \ldots, x^B\}, Y^{t+1} = \{y^1, \ldots y^B\}.$$

It may thus be determined whether the error matrix $\widehat{\Delta G}$ fulfils the accuracy condition.

According to one embodiment, the computational memory is connected to a correction unit that is configured to scale and/or offset the measured result y of the computation task with a scale value y and offset value respectively in order to obtain a corrected result z (e.g., $z = \gamma \cdot y + \beta$). The iterative process is configured to find the optimal values of the scale and offset. For that, in each iteration, the method comprises: performing a scale and/or offset of the measured result by the correction unit and adapting the scale value and/or offset value based on the corrected result, wherein the repetition is performed until the measured result and the corrected result fulfill the accuracy condition.

In one embodiment, the memristive devices may be binary devices containing two states for 0 and 1. The present disclosure may be advantageous because the binary devices may be stochastic in the sense that there is a noise on the 0 and 1 states. That is, there is a probability that programming a 1 state may result in a 0 state and vice versa. The error matrix may be estimated in each iteration using the multivariate linear regression based approach or the ML based approach. And in case the error matrix does not fulfill the accuracy condition for a current iteration t, the matrix may be updated as follows:

$$G_{ij}^t = \begin{cases} G_{tar_{ij}} + \gamma \cdot \mathcal{N}(0, \sigma) \text{ with probability } 1 - p_{flip} \\ \overline{G_{tar_{ij}}} + \gamma \cdot \mathcal{N}(0, \sigma) \text{ with probability } p_{flip} \end{cases},$$

where $\gamma$, $\sigma \in \mathbb{R}_{\geq 0}$ are device specific parameters of the gaussian noise $\mathcal{N}$ and $p_{flip} \in [0,1]$ represents the probability that the device would be programmed to the wrong bit.

Figure 1:
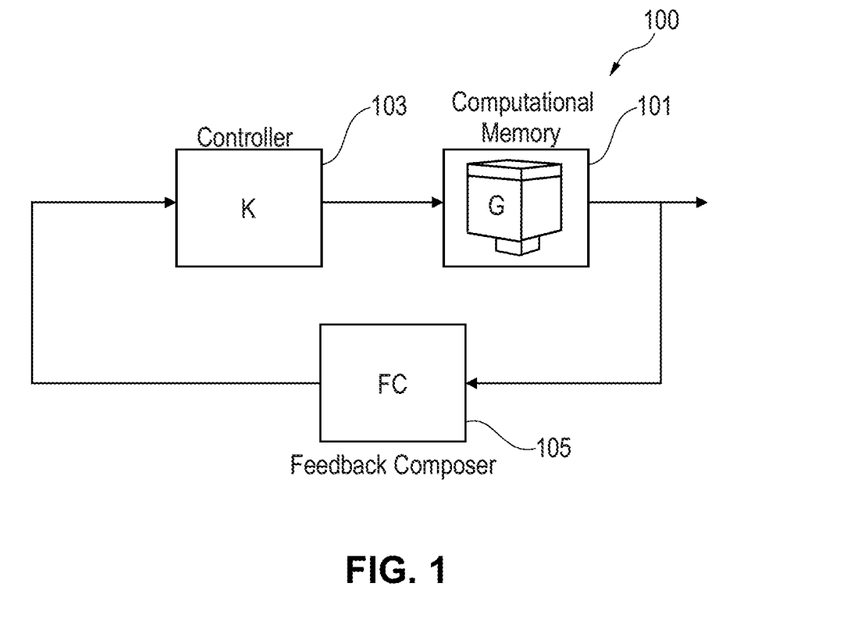
FIG. 1 illustrates a block diagram of a device, in accordance with some embodiments of the present disclosure.

Referring now to FIG. 1, shown is a simplified schematic block diagram of a device 100 in accordance with an example of the present disclosure. The device 100 may be configured to perform computing tasks in-memory such as multiplication, vector-vector multiplication, and matrix-vector multiplication.

The device 100 comprises a computational memory 101, a controller 103 and a module 105 which may be referred to as a composer or feedback composer (FC). The computational memory 101 may, for example, be configured to perform a computation task based on provided target elements also referred to as a set of first elements. The set of first elements may, for example, comprise numbers. The computational memory 101 may, for example, be configured to store second elements that represent the set of first elements respectively and to perform in-memory the computation task using the stored second elements. The computational memory 101 may, for example, comprise memristive devices, each having a conductance value represented by a second element, wherein the set of second elements are the conductance values. The memristive devices may, for example, comprise phase change memories (PCM) cells, resistive random-access memory (RRAM) cells, static random-access memory (SRAM) cells, or electro-chemical random-access memory (ECRAM) cells or flash cells.

The controller 103 may be configured to use inputs from the composer 105 to apply electrical programming signals to the memristive devices of the computational memory 101 in order to program conductance values of the memristive devices. The composer 105 may be configured to receive the result of the computation task performed by the computational memory 101, e.g., the composer 105 may read out/measure the result. The composer 105 may process the result according to the present disclosure.

In one example, the computation task may be a matrix-vector multiplication. In this case, the computational memory 101 may comprise an array of memristive devices with a crossbar structure but it is not meant to be limited to this structure. The controller 103 may comprise circuitry for programming the memristive devices during data write or programming operations such that a multiplication of a target matrix $G_{tar}$ with a vector x can be performed. The controller 103 may be configured to use a programming matrix U to apply accordingly programming signals to the memristive devices to program conductance values of the memristive devices for a matrix-vector multiplication. The conductance values represent elements of the matrix $G_{tar}$ respectively. The device 100 may be configured to apply read out voltages to the rows of the memory crossbar array. The read out voltages represent vector elements of the vector x that shall be multiplied with the matrix $G_{tar}$. The composer 105 may be configured to read out/measure current values of columns of the memory array. The current values represent vector elements of a result vector y of the multiplication of the input voltages with the conductance values. The composer 105 may be configured to receive the result vector y of the multiplication.

The device 100 may be configured according to the present disclosure for performing an iterative process in order to accurately store elements in the computational memory 101 that are used to perform a computation task by the computational memory 101. For example, the device 100 may be configured to perform the iterative process in order to program matrix elements for the matrix-vector multiplication without individual readout of elements from the computational memory 101. The iterative process may, for example, be performed by repeating steps a) and b) until the measured result from the computational memory 101 fulfills an accuracy condition, wherein step a) comprises performing the computation task by the computational memory using the set of second elements, and step b) comprises adapting at least part of the set of second elements in the computational memory based on the measured result of the computation task.

Figure 2:
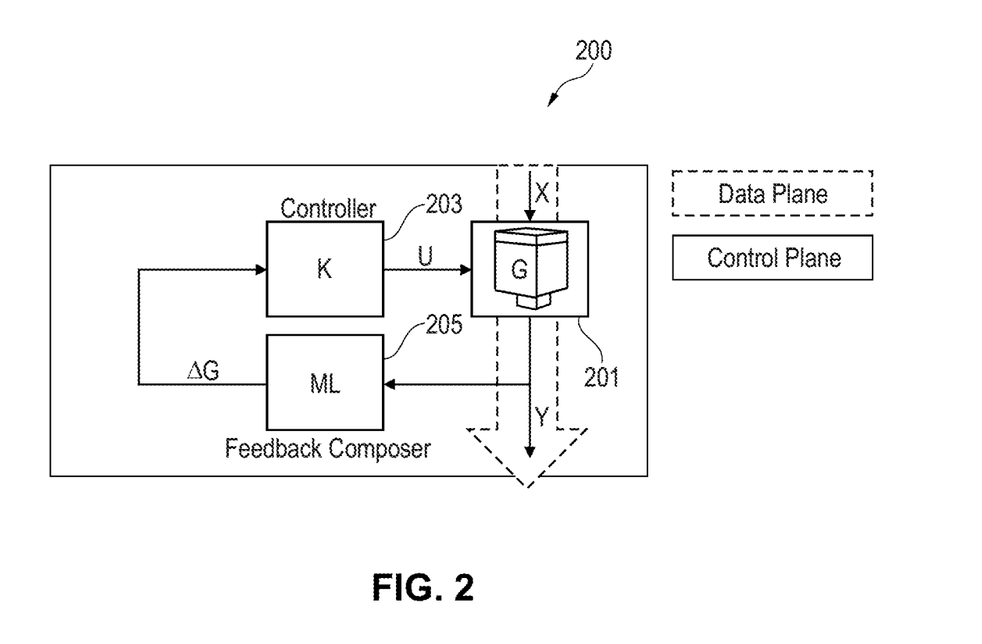
FIG. 2 illustrates a block diagram of a device, in accordance with some embodiments of the present disclosure.

Referring now to FIG. 2, shown is a simplified schematic block diagram of a device 200 in accordance with an example of the present disclosure.

The device 200 comprises a computational memory 201, a controller 203 and a composer 205. The computational memory 201 may comprise an array of memristive devices with a crossbar structure for performing matrix-vector multiplications of a matrix $G_{tar}$ with a vector. The crossbar array structure comprises n row lines and m column lines and memristive devices coupled between the row lines and the column lines at junctions formed by the row and column lines. At an initial state, the computational memory 201 may comprise a matrix $G^0$ of conductance values. These conductance values of the matrix $G^0$ may be programmed in the computational memory 201 using respective elements of a programming matrix $U^0$.

For example, a set of B input vectors $x^i \in \mathbb{R}^n$ ($i \in \{1 \ldots B\}$) may be provided. For each input vector $x^i$, the target/desired result $y_{tar}^i \in \mathbb{R}^m$ of the matrix-vector multiplication operation may be defined as follows:

$$y_{tar}^i = G_{tar}^T x^i, \text{ where } G_{tar} \in \mathbb{R}^{n \times m} \text{ is the target matrix.}$$

And for a current iteration t+1 of the iterative process, the following may be performed. Each matrix element $G_{tar\,ij}$ of the target matrix $G_{tar}$ may currently be encoded with conductance value $G_{ij}^t$ of the corresponding memristive device of the computational memory 101. In order to perform each matrix-vector multiplication $G_{tar}^T x^i$, a vector of input voltages $V^i$ representing the vector values of $x^i$ may be applied to row lines of the crossbar array. The actual result $y^i$ of the matrix-vector multiplication operation may be defined as:

$$y^i = G^{t^T} V^i.$$

The processing of the set of input vectors $X = \{x^1, \ldots, x^B\}$ may result in a set of B output vectors $Y^{t+1} = \{y^1, \ldots, y^B\}$.

The composer 205 may be configured to receive the set of output vectors $Y^{t+1}$ and to estimate an error matrix $\Delta G$ according to a machine learning based method. For that, a loss function may be defined as follows:

$$\mathcal{L}_G = \sum_{i=1}^{B} \frac{\|y_{tar}^i - y^i\|_2^2}{\|y_{tar}^i\|_2^2},$$

and the associated gradient may be defined as:

$$\nabla \mathcal{L} = \sum_{i=1}^{B} \nabla \mathcal{L}_{G^i} \text{ where } \nabla \mathcal{L}_{G^i} = \frac{-1}{\|y_{tar}^i\|_2^2} x^i (y_{tar}^i - y^i)^T.$$

The i-th gradient may be calculated by plugging the definition of the output vector $y^i$ into the loss function and applying derivation rules. The error matrix $\Delta G$ may be obtained using the gradient $\nabla \mathcal{L}_G$, e.g., $\Delta G = \nabla \mathcal{L}_G$. Thus, the composer 205 has provided error matrix $\Delta G$ according to the ML-based method.

The error matrix $\Delta G$ may be provided as input to the controller 203. The controller 203 my check whether the error matrix $\Delta G$ fulfills an accuracy condition. In case the error matrix $\Delta G$ fulfills the accuracy condition, the current matrix $G^t$ of conductance values may be provided as an accurate representation of the target matrix $G_{tar}$ and the iterative process may end. In case the error matrix $\Delta G$ does not fulfil the accuracy condition, the controller 203 may use the error matrix $\Delta G$ to estimate a programming matrix $U^{t+1} \in \mathbb{R}^{n \times m}$ that brings the error matrix $\Delta G$ close to 0. For that, the following may be performed by the controller 203. A matrix $U_{FP} \in \mathbb{R}^{t+1}$ accumulating full precision gradients may be provided. The current value of the matrix $U_{FP}^{t+1}$ may be defined as follows:

$$U_{FP}^{t+1} = U_{FP}^t + \eta \Delta G,$$

where $\eta \in \mathbb{R}$ is a learning rate that controls the magnitude of gradient updates. A floored version of the FP matrix $U_{FP}^{t+1}$ may be defined as follows:

$$U_{INT}^{t+1} = \lfloor U_{FP}^{t+1} \rfloor, \text{ where } U_{INT} \in \mathbb{Z}_{\geq 0}^{n \times m}.$$

The floored version may be used so that if a change in this matrix compared to the programming matrix $U^t$ is $\geq \delta$ the value in $U^t$ may be updated with the value in $U_{INT}^{t+1}$, where $\delta \in \mathbb{Z}_{\geq 0}$ is a threshold above which a change is induced in the programming matrix, e.g., $\delta = 2$, $\eta = 2e3$. For that, a Boolean matrix $T_{i,j}^{t+1}$, that indicates the points where the programming matrix $U^t$ was updated, may be evaluated, $T \in \{\text{True}, \text{False}\}_{\geq 0}^{n \times m}$. The Boolean matrix may be used as a mask $(U^{t+1} \wedge T_{i,j}^{t+1})$ for output of the controller:

$$T_{i,j}^{t+1} = \begin{cases} 1 & \text{if } |U_{INT_{i,j}}^{t+1} - U_{i,j}^t| \geq \delta \\ 0 & \text{if } |U_{INT_{i,j}}^{t+1} - U_{i,j}^t| < \delta \end{cases}.$$

The current programming matrix may thus first be defined as:

$$U_{i,j}^{t+1} = \begin{cases} U_{INT_{i,j}}^{t+1} & \text{if } T_{i,j}^{t+1} \equiv 1 \\ U_{i,j}^{t} & \text{if } T_{i,j}^{t+1} \equiv 0 \end{cases}.$$

The current programming matrix may be obtained using the mask as follows:

$$U^{t+1} = U^{t+1} \wedge T_{i,j}^{t+1}$$

and may be used by the controller 203 to apply accordingly programming signals to the memristive devices to program conductance values of the memristive devices to obtain matrix $G^{t+1}$ for a next iteration of the iterative process. For example, programing signals may only be generated for elements of the matrix $U^{t+1}$ that have been changed compared to $U^{t}$ in order to program corresponding memristive devices.

The device 200 of FIG. 2 may enable a ML-based approach where a data plane may be defined by the function of the computational memory 201 its input vectors X and the output vectors Y, and a control plane defined by the function of the composer 205 and the controller 203 and their respective input and outputs. The data plane represents the measurement part of the device 200 and the control plane represents the part that generates the updates for the elements of the computational memory.

Figure 3A:
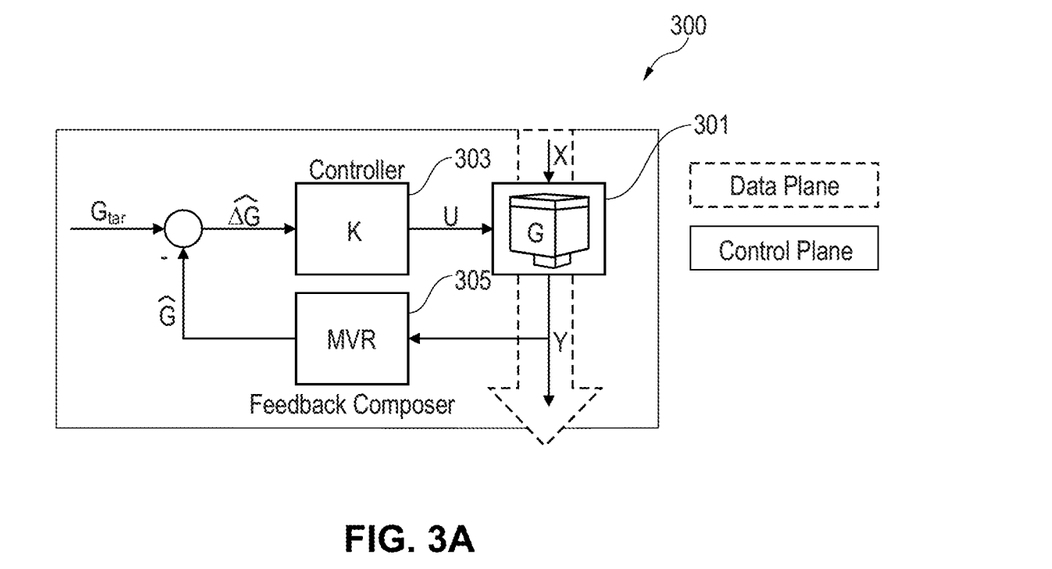
FIG. 3A illustrates a block diagram of a device, in accordance with some embodiments of the present disclosure.

Referring now to FIG. 3A, shown is a simplified schematic block diagram of a device 300 in accordance with an example of the present disclosure.

The device 300 comprises a computational memory 301, a controller 303 and a composer 305. The computational memory 301 may comprise an array of memristive devices with a crossbar structure for performing matrix-vector multiplications. The crossbar array structure comprises n row lines and m column lines and memristive devices coupled between the row lines and the column lines at junctions formed by the row and column lines. At an initial state, the computational memory 301 may comprise a matrix $G^0$ of conductance values. These conductance values of the matrix $G^0$ may be programmed in the computational memory 301 using respective elements of a programming matrix $U^0$.

For example, a set of B input vectors $x^i \in \mathbb{R}^n$ ($i \in \{1 \ldots B\}$) may be provided. For each input vector $x^i$, the target/desired result $y_{tar}^i \in \mathbb{R}^m$ of the matrix-vector multiplication operation may be defined as follows:

$y_{tar}^i = G_{tar}^T x^i$, where $G_{tar} \in \mathbb{R}^{n \times m}$ is the target matrix.

And for a current iteration t+1, the following may be performed. Each matrix element $G_{tarij}$ of the target matrix $G_{tar}$ may currently be encoded with conductance value $G_{ij}^t$ of the corresponding memristive device of the computational memory 301. In order to perform each MVM operation $G_{tar}^T x^i$, a vector of input voltages $V^i$ representing the vector values of $x^i$ may be applied to lines of the crossbar array. The actual result $y^i$ of the MVM operation may be defined as:

$y^i = G^{tT} V^i$.

The set of input vectors $X = \{x^1, \ldots, x^B\}$ may be processed resulting in a set of B output vectors $Y^{t+1} = \{y^1, \ldots, y^B\}$.

The composer 305 may be configured to receive the set of output vectors $Y^{t+1}$ and to estimate a conductance matrix $\hat{G}$ as follows:

$\hat{G} = (X^T X)^{-1} X^T Y$ and an error matrix as follows:

$\widehat{\Delta G} = G_{tar} - \hat{G}$ according to a Multivariate linear regressor (MVR)-based method.

The error matrix $\widehat{\Delta G}$ may be provided as input to the controller 303. The controller 303 my check whether the error matrix $\widehat{\Delta G}$ fulfills an accuracy condition. In case the error matrix $\widehat{\Delta G}$ fulfills the accuracy condition, the matrix $G^t$ of conductance values may be provided as an accurate representation of the target matrix and the iterative process may end. In case the error matrix $\widehat{\Delta G}$ does not fulfil the accuracy condition, the controller 303 may use the error matrix $\widehat{\Delta G}$ to estimate a programming matrix $U^{t+1} \in \mathbb{R}^{n \times m}$ that brings the conductance matrix G close to the target matrix $G_{tar}$. The programming matrix $U^{t+1}$ may be obtained from the last programming matrix $U^t$ as follows:

$$U^{t+1} = U^t + \begin{cases} \eta \cdot \widehat{\Delta G}, & \text{at } idx_{high} \\ 0, & \text{at } idx_{low} \end{cases},$$

where $\eta \in \mathbb{R}$ is a control gain and $idx_{low}$ and $idx_{high}$ are Boolean values defined as follows:

$idx_{high} = (\eta \cdot \widehat{\Delta G} \geq \text{TOL})$ and $idx_{low} = (\eta \cdot \widehat{\Delta G} < \text{TOL})$, where $\text{TOL} \in \mathbb{R}$ is a tolerance indicating a smallest possible update. The current programming matrix $U_{i,j}^{t+1}$ may be used by the controller 303 to apply accordingly programming signals to the memristive devices to program conductance values of the memristive devices to obtain matrix $G^{t+1}$ for a next iteration of the iterative process. For example, programing signals may only be generated for elements of the matrix $U^{t+1}$ that have been changed compared to $U^t$ in order to program corresponding memristive devices.

The device of FIG. 3A may thus enable a Multivariate linear regressor (MVR)-based approach.

Figure 3B:
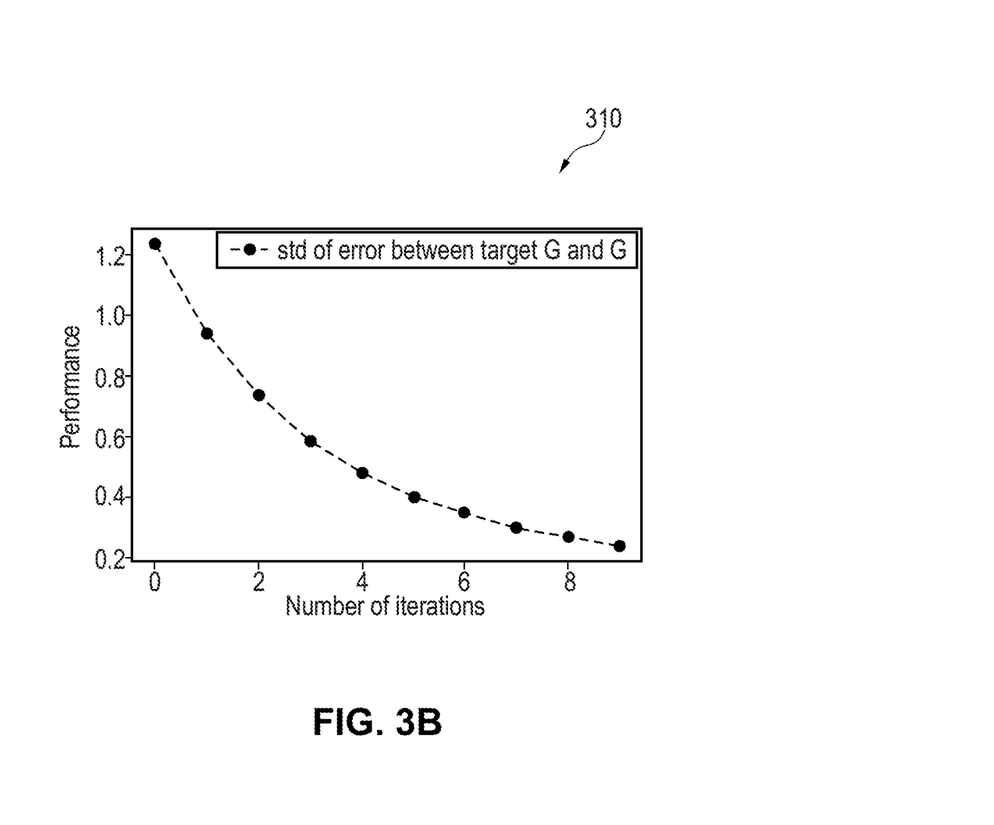
FIG. 3B illustrates a performance plot, in accordance with some embodiments of the present disclosure.

Referring now to FIG. 3B, shown is a plot 310 indicating performance of the device 300. Plot 310 shows the standard error between the target matrix $G_{tar}$ and the encoded matrix G as function of the number of iterations. As shown in the plot 310, the error decreases as the number of iterations increases.

Figure 4:
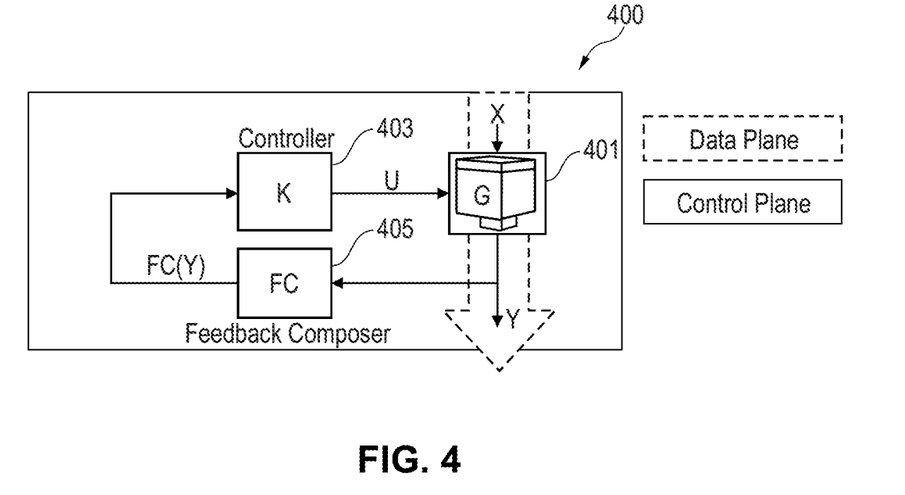
FIG. 4 illustrates a block diagram of a device, in accordance with some embodiments of the present disclosure.

Referring now to FIG. 4, shown is a simplified schematic block diagram of a device 400 in accordance with an example of the present disclosure.

The device 400 comprises a computational memory 401, a controller 403 and a composer 405. The computational memory 401 may comprise an array of memristive devices with a crossbar structure for performing matrix-vector multiplications. The crossbar array structure comprises n row lines and m column lines and memristive devices coupled between the row lines and the column lines at junctions formed by the row and column lines. The memristive devices may be binary devices containing two states for 0 and 1. For example, number 2 can be written in binary representation as 10 with two cells being programmed to $[G_{max}, 0]$ respectively. Thus, the target matrix $G_{tar}$ may be defined as:

$G_{tar} \in \{0, G_{max}\}^{n \times m}$

For example, a set of B input vectors $x^i \in \mathbb{R}^n$ ($i \in \{1 \ldots B\}$) may be provided. For each input vector $x^i$, the target/desired result $y_i^{tar} \in \mathbb{R}^m$ of the matrix-vector multiplication operation may be defined as follows:

$y_{tar}^i = G_{tar}^T x^i$, where $G_{tar} \in \mathbb{R}^{n \times m}$ is the target matrix.

And for a current iteration t+1, the following may be performed. Each matrix element $G_{tarij}$ of the target matrix $G_{tar}$ may currently be encoded with conductance value $G_{ij}^t$ of the corresponding memristive device of the computational memory 401. In order to perform each MVM operation $G_{tar}^T x^i$, a vector of input voltages $V^i$ representing the vector values of $x^i$ may be applied to lines of the crossbar array. The actual result $y^i$ of the MVM operation may be defined as:

$$y^i = G^{t^T} V^i.$$

The set of input vectors $X=\{x^1, \ldots, x^B\}$ may be processed resulting in a set of B output vectors $Y^{t+1} = \{y^1, \ldots, y^B\}$. The composer 405 may be configured to receive the set of output vectors $Y^{t+1}$ and to estimate a conductance matrix $\hat{G}$ as follows: $\hat{G} = (X^T X)^{-1} X^T Y$ and an error matrix as follows $\widehat{\Delta G} = G_{tar} - \hat{G}$. The error matrix $\widehat{\Delta G}$ may be provided as input to the controller 403. The controller 403 my check whether the error matrix $\widehat{\Delta G}$ fulfills an accuracy condition by checking whether all absolute element values of the error matrix are smaller than a threshold $\epsilon \in \mathbb{R}$. In case the error matrix $\widehat{\Delta G}$ fulfills the accuracy condition the matrix $G^t$ of conductance values may be provided as an accurate representation of the target matrix and the iterative process may end. In case the error matrix $\widehat{\Delta G}$ does not fulfil the accuracy condition, the controller 403 may identify the absolute element values of the error matrix which are higher than or equal to the threshold $\epsilon \in \mathbb{R}$ (i.e., abs($\widehat{\Delta G}$) $\geq \epsilon$) and the corresponding element i,j of the conductance matrix may be updated as follows:

$$G_{ij}^{t+1} = \begin{cases} G_{tar_{ij}} + \gamma \cdot \mathcal{N}(0, \sigma) & \text{with probability } 1 - p_{flip} \\ \overline{G_{tar_{ij}}} + \gamma \cdot \mathcal{N}(0, \sigma) & \text{with probability } p_{flip} \end{cases},$$

where $\gamma, \sigma \in \mathbb{R}_{\geq 0}$ are device specific parameters of the gaussian noise $\mathcal{N}$ and $p_{flip} \in [0,1]$ represents the probability that the device would be programmed to the wrong bit. When the update is performed, there may be some noise $\mathcal{N}$ on the conductance that the device reaches. This noise $\mathcal{N}$ may be Gaussian. The parameters of the Gaussian noise may be specific to the individual devices, and thus are referred to as device specific parameters.

Another example implementation of the binary devices using a multibit setup may be provided. For example, an IMC MVM engine may be used, where every single PCM device can encode the two states $\{0, G_{max}\}$, but through vertically stacking N devices. The stack of devices may provide a differential setup of N devices. Using this differential setup, weights can be stored using 2N binary devices. The amount of set devices for each differential N device setup may be stored in the matrix $U = S \cdot G_{max}$, where $S \in [N]^{2 \times n \times m}$ and $[N] := \{0, \ldots, N\}$. Inputs may be applied to the MVM engine, and the outputs may be collected so that one of the ML based method and MVR based method described above may be used by the composer 405 to produce error matrix for the controller 403. For example, in case of a ML based approach, for all array elements i,j where the error matrix $\Delta G^*$ is above a tolerance value, the matrix U may be updated by the controller 403. The values stored in U at indices where U was changed may be applied to the binary devices to set on average the required amount of devices. This may be repeated to let G converge to $G_{tar}$.

Figure 5:
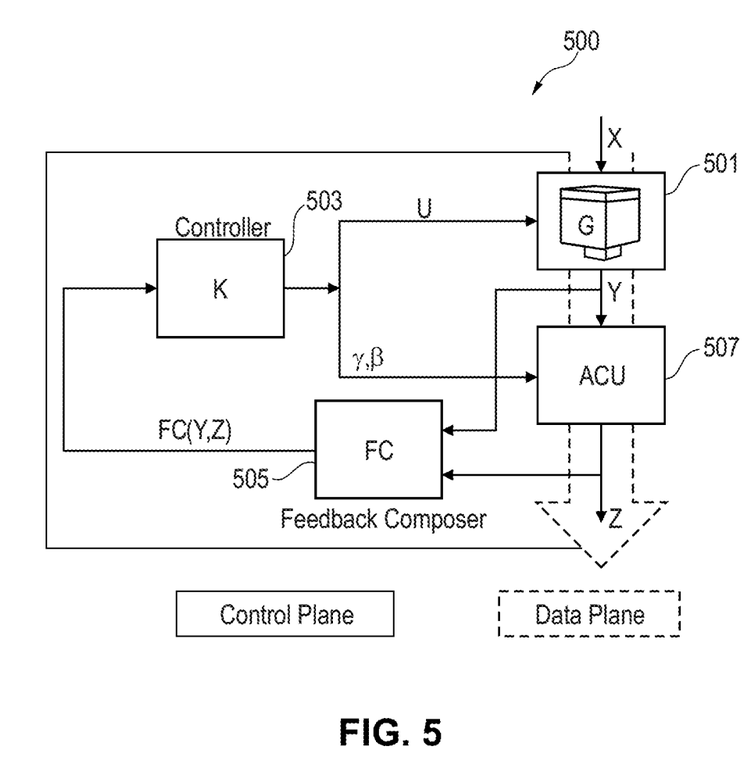
FIG. 5 illustrates a block diagram of a device, in accordance with some embodiments of the present disclosure.

Referring now to FIG. 5, shown is a simplified schematic block diagram of a device 500 in accordance with an example of the present disclosure.

The device 500 comprises a computational memory 501, a controller 503, an affine correction unit (ACU) 507 and a composer 505. The computational memory 501 may comprise an array of memristive devices with a crossbar structure for performing matrix-vector multiplications. The crossbar array structure comprises n row lines and m column lines and memristive devices coupled between the row lines and the column lines at junctions formed by the row and column lines.

For example, a set of B input vectors $x^i \in \mathbb{R}^n$ (i $\in \{1 \ldots B\}$) may be provided. For each input vector $x^i$, the target/desired result $y^{tar}_i \in \mathbb{R}^m$ m of the matrix-vector multiplication operation may be defined as follows:

$$y_{tar}^i = G_{tar}^T x^i,$$

where $G_{tar} \in \mathbb{R}^{n \times m}$ is the target matrix. And for a current iteration t+1, the following may be performed. Each matrix element $G_{tar_{ij}}$ of the target matrix $G_{tar}$ may currently be encoded with conductance value $G_{ij}^t$ of the corresponding memristive device of the computational memory 101. In order to perform each MVM operation $G_{tar}^T x^i$, a vector of input voltages $V^i$ representing the vector values of $x^i$ may be applied to lines of the crossbar array. The actual result $y^i$ of the MVM operation may be defined as:

$$y^i = G^{t^T} V^i.$$

The set of input vectors $X = \{x^1, \ldots, x^B\}$ may be processed resulting in a set of B output vectors $Y^{t+1} = \{y^1, \ldots, y^B\}$. The correction unit 507 may be configured to correct the output vectors $Y^{t+1} = \{y^1, \ldots, y^B\}$ using a scale $\gamma^t$ and an offset $\beta^t$ as follows:

$$z^i = y^i \odot \gamma^t + \beta^t,$$

where $\gamma^t, \beta^t \in \mathbb{R}^m$. This may result in a current corrected vector $Z^{t+1} = \{z^1, \ldots, z^B\}$. The composer 505 may be configured to receive the set of output vectors $Y^{t+1}$ and corrected vectors $Z^{t+1} = \{z^1, \ldots, z^B\}$.

In one first co-learning example, the composer 505 may estimate an error matrix $\Delta G$ e.g., using the ML based approach as described in FIG. 2 or the MVR approach as described in FIG. 3A. In case of the ML based approach, a first loss function may be defined as follows:

$$\mathcal{L}_G = \sum_{i=1}^{B} \frac{\|y_{tar}^i - y^i\|_2^2}{\|y_{tar}^i\|_2^2},$$

and the associated gradient may be defined as:

$$\nabla \mathcal{L}_G = \sum_{i=1}^{B} \nabla \mathcal{L}_{G^i} \text{ where } \nabla \mathcal{L}_{G^i} = \frac{-2}{\|y_{tar}^i\|_2^2} x^i (y_{tar}^i - y^i)^T.$$

The change matrix $\Delta G$ may be obtained using the gradient $\nabla \mathcal{L}_G$ e.g., $\Delta G = \nabla \mathcal{L}_G$.

In addition, a gradient approach is also used by the composer 505 to estimate optimal scales and offsets. For that, a second loss function may be defined as follows:

$$\mathcal{L}_{\gamma, \beta} = \sum_{i=1}^{B} \frac{\|y_{tar}^i - y^i\|_2^2}{\|y_{tar}^i\|_2^2}$$

and the associated gradients may be defined as follows:

$$\nabla \mathcal{L}_\gamma = \sum_{i=1}^{B} \nabla \mathcal{L}_{\gamma_i} \text{ and } \nabla \mathcal{L}_\beta = \sum_{i=1}^{B} \nabla \mathcal{L}_{\beta_i}$$

$$\text{where, } \nabla \mathcal{L}_{\gamma_i} = \frac{-2a_0}{\|y_{tar}^i\|_2^2}(y_{tar}^i - (a_0 \cdot (\beta + k^i \odot \gamma) + a_1)) \odot k^i \text{ and}$$

$$\nabla \mathcal{L}_{\beta_i} = \frac{-2a_0}{\|y_{tar}^i\|_2^2}(y_{tar}^i - (a_0 \cdot (\beta + k^i \odot \gamma) + a_1)),$$

where $k^i$ is the raw outputs of the ADC of the computational memory, $y_i = a_0 \cdot (\alpha - k_i \odot \gamma) + a_1$, $a_0$, $a_1 \in \mathbb{R}$ and $k^i \in \mathbb{R}^m$. The scale and offset errors $\Delta\gamma$ and $\Delta\beta$ may be obtained from the gradients $\nabla\mathcal{L}_\gamma$ and $\nabla\mathcal{L}_\beta$ respectively, e.g., $\Delta\gamma = \nabla\mathcal{L}_\gamma$ and $\Delta\beta = \nabla\mathcal{L}_\beta$. The error matrix $\Delta G$ and the scale and offset errors $\Delta\gamma$ and $\Delta\beta$ may be provided as input to the controller 503. The controller 503 may use the received error matrix $\Delta G$ to estimate the programing matrix $U^{t+1}$ as described with reference to FIG. 2 to obtain:

$$U^{t+1} = U^{t+1} \wedge T_{i,j}^{t+1}, \text{ where } T_{i,j}^{t+1} = \begin{cases} 1 & \text{if } |U_{INT_{i,j}}^{t+1} - U_{i,j}^t| \geq \delta \\ 0 & \text{if } |U_{INT_{i,j}}^{t+1} - U_{i,j}^t| < \delta \end{cases}.$$

The controller 503 may further estimate the scale and the offset using the scale and offset errors $\Delta\gamma$ and $\Delta\beta$ as follows:

$$\gamma^{t+1} = \gamma^t - \eta_\gamma \nabla \mathcal{L}_\gamma \text{ and } \beta^{t+1} = \beta^t - \eta_\beta \nabla \mathcal{L}_\beta, \text{ where } \eta_\gamma, \eta_\beta \in \mathbb{R}.$$

In an alternative co-learning example, the composer 505 may estimate an error matrix $\Delta G$ using the ML based approach as described in FIG. 2 or the MVR approach as described in FIG. 3A. The composer 505 may further estimate optimal scales and offsets using a regression approach on current iteration t+1 using a regressor such as Huber and PCA regressor. Using the Huber regressor, the scale $S^{t+1}$ and offset $O^{t+1}$ may be determined for a current iteration t+1 as follows:

$$S^{t+1}, O^{t+1} = \text{fit}_{Regressor}(Z_{tar}, Y, \text{degree=2}), \text{ where}$$
$$z^i = y^i \odot S + O \text{ and } z_{tar}^i = y_{tar}^i \odot S + O.$$

The error matrix $\Delta G$ and the scales and offsets $S^{t+1}$ and $O^{t+1}$ may be provided as input to the controller 503. In case the error matrix $\Delta G$, $S^{t+1}$ and $O^{t+1}$ fulfill an accuracy condition, the matrix $G^t$ of conductance values may be provided as an accurate representation of the target matrix and the iterative process may end e.g., the accuracy condition may require that all elements of the error matrix and the differences $|S^{t+1} - S^t|$ and $|O^{t+1} - O^t|$ are smaller than a threshold. In case the error matrix $\Delta G$, $S^{t+1}$ or $O^{t+1}$ do not fulfil the accuracy condition, the controller 503 may use the error matrix $\Delta G$ to estimate a programming matrix $U^{t+1} \in \mathbb{R}^{n \times m}$ that brings the conductance matrix G close to the target matrix $G_{tar}$. The programming matrix $U^{t+1}$ may be obtained from the last programming matrix $U^t$ as follows:

$$U^{t+1} = U^t + \begin{cases} \eta \cdot \hat{\Delta G}, & \text{at } idx_{high} \\ 0, & \text{at } idx_{low} \end{cases},$$

where $\eta \in \mathbb{R}$ is control gain and $idx_{low}$ and $idx_{high}$ are Boolean values defined as:

$$idx_{high} = (\eta \cdot \widehat{\Delta G} \geq \text{TOL}) \text{ and } idx_{low} = (\eta \cdot \widehat{\Delta G} < \text{TOL}),$$

where $\text{TOL} \in \mathbb{R}$ is a tolerance indicating a smallest possible update. The current programming matrix $U_{i,j}^{t+1}$ may be used by the controller 503 to apply accordingly programming signals to the memristive devices to program conductance values of the memristive devices to obtain matrix $G^{t+1}$ for a next iteration of the iterative process and the scale $S^{t+1}$ and offset $O^{t+1}$ may be saved for the next iteration.

Figure 6:
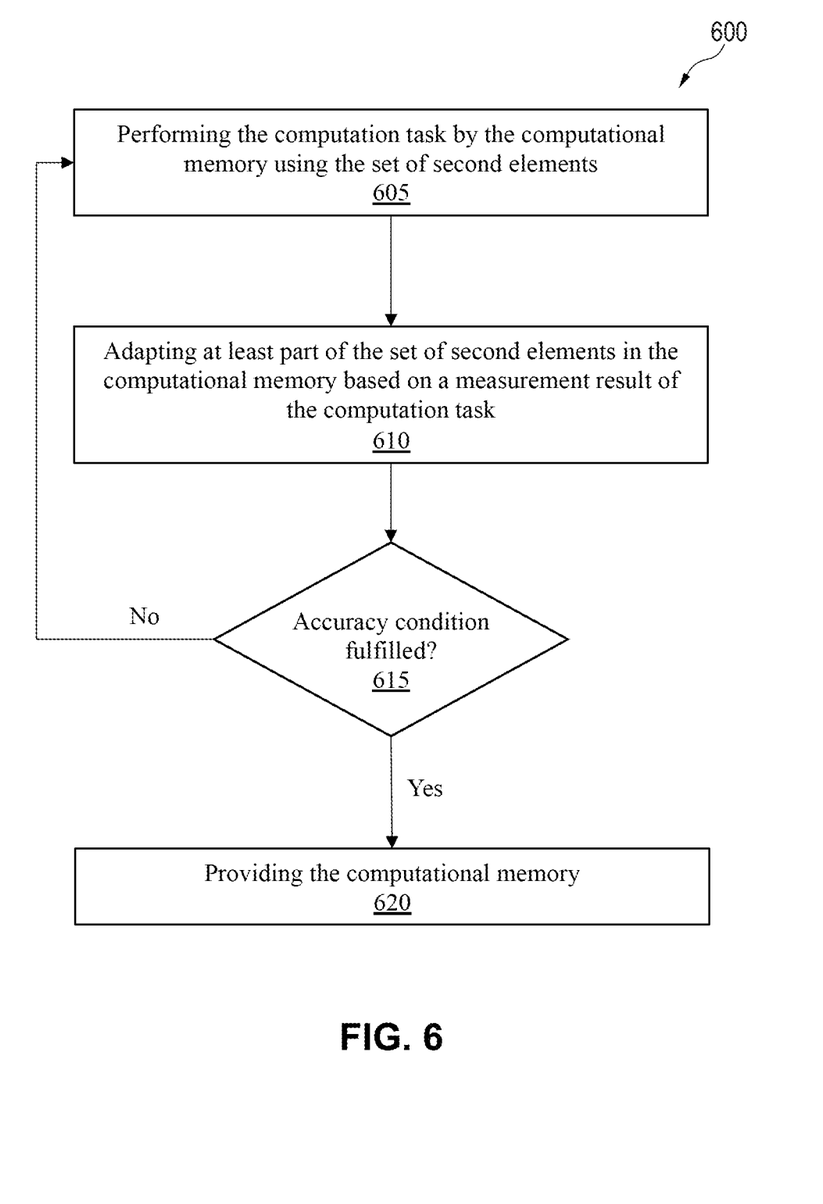
FIG. 6 illustrates a flowchart of a method for programming elements onto a computational memory, in accordance with some embodiments of the present disclosure.

Referring now to FIG. 6, shown is a flowchart of a method 600 for programming a set of first elements onto a computational memory. The computational memory is configured for performing a computation task from a set of second elements that encode the set of first elements in the computational memory respectively.

The computation task may be performed in step 605 by the computational memory using the set of second elements. A least part of the set of second elements may be adapted in step 610 in the computational memory based on a measured result of the computation task. Steps 605 to 610 may be repeated until the measured result of the computation task fulfills (step 615) an accuracy condition. If (step 615) the accuracy condition is fulfilled, the current content of the computational memory may be provided in step 620 as an optimal representation of the set of first elements.

Figure 7:
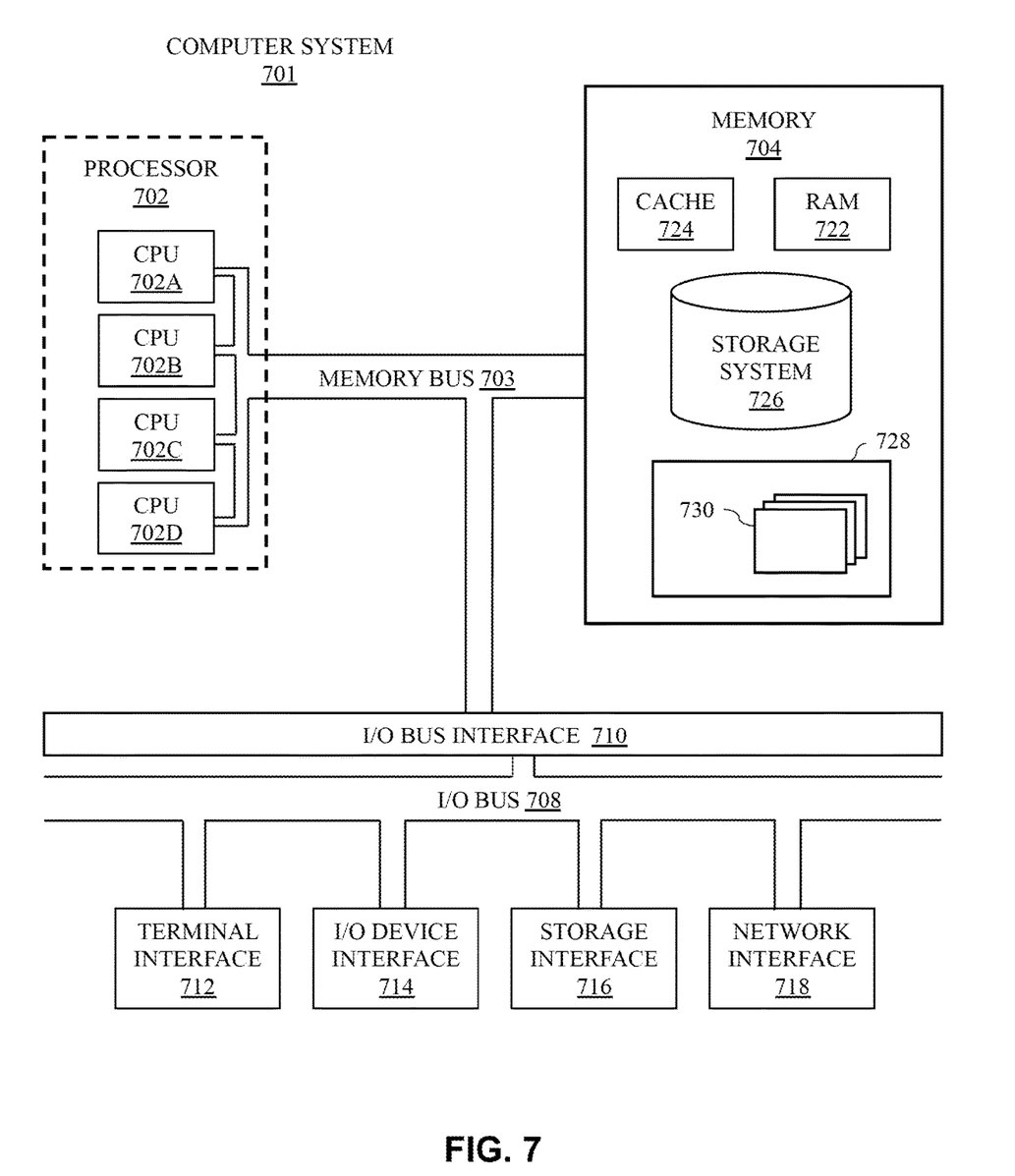
FIG. 7 illustrates a high-level block diagram of an example computer system that may be used in implementing one or more of the methods, tools, and modules, and any related functions, described herein, in accordance with embodiments of the present disclosure.

Referring now to FIG. 7, shown is a high-level block diagram of an example computer system 701 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 701 may comprise one or more CPUs 702, a memory subsystem 704, a terminal interface 712, a storage interface 716, an I/O (Input/Output) device interface 714, and a network interface 718, all of which may be communicatively coupled, directly or indirectly, for inter-component communication via a memory bus 703, an I/O bus 708, and an I/O bus interface 710.

The computer system 701 may contain one or more general-purpose programmable central processing units (CPUs) 702A, 702B, 702C, and 702D, herein generically referred to as the CPU 702. In some embodiments, the computer system 701 may contain multiple processors typical of a relatively large system; however, in other embodiments the computer system 701 may alternatively be a single CPU system. Each CPU 702 may execute instructions stored in the memory subsystem 704 and may include one or more levels of on-board cache. In some embodiments, a processor can include at least one or more of, a memory controller, and/or storage controller. In some embodiments, the CPU can execute the processes included herein (e.g., method 600 as described in FIG. 6). In some embodiments, the computer system 701 may be configured as device 100, device 200, device 300, device 400, and/or device 500.

System memory subsystem 704 may include computer system readable media in the form of volatile memory, such as random-access memory (RAM) 722 or cache memory 724. Computer system 701 may further include other removable/non-removable, volatile/non-volatile computer system data storage media. By way of example only, storage system 726 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory subsystem 704 can include flash memory, e.g., a flash memory stick drive or a flash drive. Memory devices can be connected to memory bus 703 by one or more data media interfaces. The memory subsystem 704 may include at least one program product having a set (e.g., at least one) of program modules that are configured to carry out the functions of various embodiments.

Although the memory bus 703 is shown in FIG. 7 as a single bus structure providing a direct communication path among the CPUs 702, the memory subsystem 704, and the I/O bus interface 710, the memory bus 703 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 710 and the I/O bus 708 are shown as single units, the computer system 701 may, in some embodiments, contain multiple I/O bus interfaces 710, multiple I/O buses 708, or both. Further, while multiple I/O interface units are shown, which separate the I/O bus 708 from various communications paths running to the various I/O devices, in other embodiments some or all of the I/O devices may be connected directly to one or more system I/O buses.

In some embodiments, the computer system 701 may be a multi-user mainframe computer system, a single-user system, or a server computer or similar device that has little or no direct user interface, but receives requests from other computer systems (clients). Further, in some embodiments, the computer system 701 may be implemented as a desktop computer, portable computer, laptop or notebook computer, tablet computer, pocket computer, telephone, smart phone, network switches or routers, or any other appropriate type of electronic device.

It is noted that FIG. 7 is intended to depict the representative major components of an exemplary computer system 701. In some embodiments, however, individual components may have greater or lesser complexity than as represented in FIG. 7, components other than or in addition to those shown in FIG. 7 may be present, and the number, type, and configuration of such components may vary.

One or more programs/utilities 728, each having at least one set of program modules 730 may be stored in memory subsystem 704. The programs/utilities 728 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs/utilities 728 and/or program modules 730 generally perform the functions or methodologies of various embodiments.

The present disclosure may comprise the following clauses.

Clause 1. A method for programming a set of first elements onto a computational memory, the computational memory being configured for performing a computation task from a set of second elements that encode the set of first elements in the computational memory respectively; the method comprising: performing an iterative process comprising repeatedly: performing the computation task by the computational memory using the set of second elements and adapting at least part of the set of second elements in the computational memory based on a measured result of the computation task, until the measured result of the computation task fulfills an accuracy condition.

Clause 2. The method of clause 1, adapting the at least part of the set of second elements comprising: estimating the result of the computation task using the set of first elements; comparing the estimated result with the measured result; and using the comparison result for updating the set of second elements such that a difference between the estimated result and the measured result is minimized.

Clause 3. The method of clause 1, adapting the at least part of the set of second elements comprising: estimating using the measured result the set of first elements; comparing the estimated set of elements with the set of first elements; and using the comparison result for updating the set of second elements such that a difference between the estimated elements and the first elements is minimized.

Clause 4. The method of any of the preceding clauses 1 to 3, the computational memory being connected to a correction unit that is configured to scale and/or offset the measured result with a scale value and offset value respectively to obtain a corrected result, wherein in each iteration the method comprises: performing a scale and/or offset of the measured result by the correction unit, and adapting the scale value and/or offset value based on the corrected result, wherein the repetition is performed until the measured result and the corrected result fulfill the accuracy condition.

Clause 5. The method of any of the preceding clauses 1 to 4, the computational memory comprising an array of memristive devices, the array storing the set of second elements as a matrix G of conductance values, wherein the set of first elements are elements of a target matrix $G_{tar}$; the computation task being a matrix-vector multiplication.

Clause 6. The method of clause 5, further comprising in each iteration t: estimating a deviation $\Delta G$ between the target matrix $G_{tar}$ and the actual matrix $G^{t-1}$ based on a predefined loss function, amending a programming matrix $U^t$ so that the deviation $\Delta G$ becomes close to zero, and using the programming matrix $U^t$ to adapt the set of second elements of the matrix $G^{t-1}$ to obtain a matrix $G^t$ for a next iteration t+1, wherein the accuracy condition requires that the deviation $\Delta G$ is smaller than a threshold.

Clause 7. The method of clause 6, further comprising: providing B input vectors $x^1 \ldots x^B$; wherein in each iteration the method comprises performing B matrix-vector multiplications $y^i = G^T x^i$ of the input vectors with the matrix G, wherein the loss function is defined by:

$$\sum_{i=1}^{B} \frac{\|y_{tar}^i - y^i\|_2^2}{\|y_{tar}^i\|_2^2}, \text{ where } y_{tar}^i = G_{tar}^T x^i.$$

Clause 8. The method of clause 5, further comprising in each iteration t, determining an estimate $\hat{G}$ of the actual matrix $G^{t-1}$ via multivariate linear regression, amending a programming matrix $U^t$ that brings the estimate $\hat{G}$ close to the target matrix $G_{tar}$, and using the programming matrix $U^t$ to adapt the set of second elements of the matrix $G^{t-1}$ to obtain a matrix $G^t$ for a next iteration t+1, wherein the accuracy condition requires that the estimate G is close to the target matrix $G_{tar}$ by a shift.

Clause 9. The method of clause 8, further comprising: providing B input vectors $x^1 \ldots x^B$; wherein in each iteration the method comprises performing B matrix-vector multiplications $y^i = G^T x^i$ of the input vectors with the matrix G, where $i \in \{1 \ldots B\}$, wherein $\hat{G} = (X^T X)^{-1} X^T Y$, where X is a matrix of the input vectors and Y is a matrix of the vectors $y^i$.

Clause 10. The method of clause 5, the memristive devices being binary devices containing two states, the method further comprising in each iteration t: determining an error matrix ΔG between the target matrix $G_{tar}$ and the actual matrix $G^{t-1}$, in case the error matrix does not fulfill the accuracy condition, the adapting at least part of the set of second elements comprises adapting the states of the binary devices for a next iteration t+1 according to the matrix:

$$G_{ij}^t = \begin{cases} G_{tar_{ij}} + \gamma \cdot \mathcal{N}(0, \sigma) & \text{with probability } 1 - p_{flip} \\ \overline{G_{tar_{ij}}} + \gamma \cdot \mathcal{N}(0, \sigma) & \text{with probability } p_{flip} \end{cases},$$

where $\gamma, \sigma \in \mathbb{R}_{\geq 0}$ are device specific parameters of the gaussian noise $\mathcal{N}$ and $p_{flip} \in [0,1]$ represents the probability that the device would be programmed to the wrong bit.

Clause 11. The method of any of the preceding clauses 1 to 10, the computational memory comprising any one of: a crossbar array of memristive devices; and a crossbar array of charge-based memory devices. (e.g., memory device such as SRAM, DRAM, Flash and FeRAM).

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

Various embodiments provide a method, device, computer program product as described by the disclosure of the independent claims. Advantageous embodiments are described in the dependent claims. Embodiments of the present disclosure can be freely combined with each other if they are not mutually exclusive.

In one aspect, the disclosure relates to a method for programming a set of first elements onto a computational memory, the computational memory being configured for performing a computation task from a set of second elements that encode the set of first elements in the computational memory respectively; the method comprising: performing an iterative process comprising repeatedly: performing the computation task by the computational memory using the set of second elements and adapting at least part of the set of second elements in the computational memory based on a measured result of the computation task, until the measured result of the computation task fulfills an accuracy condition.

In one aspect, the disclosure relates to a computer program product comprising a computer-readable storage medium having computer-readable program code embodied therewith, the computer-readable program code configured to implement steps of the method according to preceding embodiments.

In one aspect, the disclosure relates to a device comprising a computational memory configured for storing a set of second elements that encode a set of first elements and performing a computation task from the set of second elements, the device being configured for executing an iterative process comprising: repeatedly: performing the measurement by the computational memory and adapting at least part of the set of second elements in the computational memory based on a measured result of the computation task, until the measured result fulfills an accuracy condition.

What is claimed is:

1. A method for programming a set of first elements onto a computational memory, the computational memory being configured for performing a computation task from a set of second elements that encode the set of first elements in the computational memory respectively; the method comprising:
performing an iterative process comprising:
performing the computation task by the computational memory using the set of second elements; and
adapting at least part of the set of second elements in the computational memory based on a measured result of the computation task, until the measured result of the computation task fulfills an accuracy condition.

2. The method of claim 1, wherein adapting the at least part of the set of second elements comprises:
estimating the result of the computation task using the set of first elements;
comparing the estimated result with the measured result; and
updating, based on the comparing, the set of second elements such that a difference between the estimated result and the measured result is minimized.

3. The method of claim 1, wherein the computational memory is connected to a correction unit that is configured to scale and/or offset the measured result with a scale value and an offset value respectively to obtain a corrected result, wherein in each iteration the method comprises:
performing a scale and/or an offset of the measured result by the correction unit; and
adapting the scale value and/or the offset value based on the corrected result, wherein the repetition is performed until the measured result and the corrected result fulfill the accuracy condition.

4. The method of claim 1, wherein the computational memory comprises an array of memristive devices, the array storing the set of second elements as a matrix G of conductance values, wherein the set of first elements are elements of a target matrix $G_{tar}$, and wherein the computation task is a matrix-vector multiplication.

5. The method of claim 4, further comprising in each iteration t:
estimating a deviation $\Delta G$ between the target matrix $G_{tar}$ and the actual matrix $G^{t-1}$ based on a predefined loss function;
amending a programming matrix $U^t$ so that the deviation $\Delta G$ becomes close to zero; and
adapting, using the programming matrix $U^t$, the set of second elements of the matrix $G^{t-1}$ to obtain a matrix $G^t$ for a next iteration t+1, wherein the accuracy condition requires that the deviation $\Delta G$ is smaller than a threshold.

6. The method of claim 5, further comprising:
providing B input vectors $x^1 \ldots x^B$, wherein in each iteration the method comprises performing B matrix-vector multiplications $y^i = G^T x^i$ of the input vectors with the matrix G, wherein the loss function is defined by:

$$\sum_{i=1}^{B} \frac{\|y_{tar}^i - y^i\|_2^2}{\|y_{tar}^i\|_2^2}, \text{ where } y_{tar}^i = G_{tar}^T x^i.$$

7. The method of claim 4, further comprising in each iteration t:
determining an estimate $\hat{G}$ of the actual matrix $G^{t-1}$ via multivariate linear regression;
amending a programming matrix $U^t$ that brings the estimate $\hat{G}$ close to the target matrix $G_{tar}$; and
adapting, using the programming matrix $U^t$, the set of second elements of the matrix $G^{t-1}$ to obtain a matrix $G^t$ for a next iteration t+1, wherein the accuracy condition requires that the estimate $\hat{G}$ is close to the target matrix $G_{tar}$ by a shift.

8. The method of claim 7, further comprising: providing B input vectors $x^1 \ldots x^B$, wherein in each iteration the method comprises performing B matrix-vector multiplications $y^i = G^T x^i$ of the input vectors with the matrix G, where $i \in \{1 \ldots B\}$, wherein $\hat{G} = (X^T X)^{-1} X^T Y$, where X is a matrix of the input vectors and Y is a matrix of the vectors $y^i$.

9. The method of claim 4, the memristive devices being binary devices containing two states, the method further comprising in each iteration t:
determining an error matrix $\Delta G$ between the target matrix $G_{tar}$ and the actual matrix $G^{t-1}$, wherein if the error matrix does not fulfill the accuracy condition, the adapting at least part of the set of second elements comprises:
adapting the states of the binary devices for a next iteration t+1 according to the matrix $$G_{ij}^t = \begin{cases} G_{tar_{ij}} + \gamma \cdot \mathcal{N}(0, \sigma) \text{ with probability } 1 - p_{flip} \\ \overline{G_{tar_{ij}}} + \gamma \cdot \mathcal{N}(0, \sigma) \text{ with probability } p_{flip} \end{cases},$$

where $\gamma, \sigma \in \mathbb{R}_{\geq 0}$ are device specific parameters of the gaussian noise $\mathcal{N}$ and $p_{flip} \in [0,1]$ represents the probability that the device would be programmed to a wrong bit.

10. The method of claim 1, the computational memory comprising at least one device selected from a group of devices consisting of: a crossbar array of memristive devices; and a crossbar array of charge-based memory devices.

11. A device comprising:
a computational memory configured for storing a set of second elements that encode a set of first elements and performing a computation task from the set of second elements, the device being configured for executing a method comprising:
performing an iterative process comprising:
performing the computation task by the computational memory; and
adapting at least part of the set of second elements in the computational memory based on a measured result of the computation task, until the measured result of the computation task fulfills an accuracy condition.

12. The device of claim 11, wherein adapting the at least part of the set of second elements comprises:
estimating the result of the computation task using the set of first elements;
comparing the estimated result with the measured result; and
updating, based on the comparing, the set of second elements such that a difference between the estimated result and the measured result is minimized.

13. The device of claim 11, wherein the computational memory is connected to a correction unit that is configured to scale and/or offset the measured result with a scale value and an offset value respectively to obtain a corrected result, wherein in each iteration the method comprises:
performing a scale and/or an offset of the measured result by the correction unit; and
adapting the scale value and/or the offset value based on the corrected result, wherein the repetition is performed until the measured result and the corrected result fulfill the accuracy condition.

14. The device of claim 11, wherein the computational memory comprises an array of memristive devices, the array storing the set of second elements as a matrix G of conductance values, wherein the set of first elements are elements of a target matrix $G_{tar}$, and wherein the computation task is a matrix-vector multiplication.

15. The device of claim 14, wherein the method further comprises in each iteration t:
estimating a deviation $\Delta G$ between the target matrix $G_{tar}$ and the actual matrix $G^{t-1}$ based on a predefined loss function,
amending a programming matrix $U^t$ so that the deviation $\Delta G$ becomes close to zero; and
adapting, using the programming matrix $U^t$, the set of second elements of the matrix $G^{t-1}$ to obtain a matrix $G^t$ for a next iteration t+1, wherein the accuracy condition requires that the deviation $\Delta G$ is smaller than a threshold.

16. A computer program product comprising a computer-readable storage medium having computer-readable program code embodied therewith, the computer-readable program code configured to perform a method for programming a set of first elements onto a computational memory, the computational memory being configured for performing a computation task from a set of second elements that encode the set of first elements in the computational memory respectively, the method comprising:
performing an iterative process comprising:
performing the computation task by the computational memory using the set of second elements; and
adapting at least part of the set of second elements in the computational memory based on a measured result of the computation task, until the measured result of the computation task fulfills an accuracy condition.

17. The computer program product of claim 16, wherein adapting the at least part of the set of second elements comprises:
estimating the result of the computation task using the set of first elements;
comparing the estimated result with the measured result; and
updating, based on the comparing, the set of second elements such that a difference between the estimated result and the measured result is minimized.

18. The computer program product of claim 16, wherein the computational memory is connected to a correction unit that is configured to scale and/or offset the measured result with a scale value and an offset value respectively to obtain a corrected result, wherein in each iteration the method comprises:
performing a scale and/or an offset of the measured result by the correction unit; and
adapting the scale value and/or the offset value based on the corrected result, wherein the repetition is performed until the measured result and the corrected result fulfill the accuracy condition.

19. The computer program product of claim 16, wherein the computational memory comprises an array of memristive devices, the array storing the set of second elements as a matrix G of conductance values, wherein the set of first elements are elements of a target matrix $G_{tar}$, and wherein the computation task is a matrix-vector multiplication.

20. The computer program product of claim 19, wherein the method further comprises in each iteration t:
estimating a deviation $\Delta G$ between the target matrix $G_{tar}$ and the actual matrix $G^{t-1}$ based on a predefined loss function,
amending a programming matrix $U^t$ so that the deviation $\Delta G$ becomes close to zero; and
adapting, using the programming matrix $U^t$, the set of second elements of the matrix $G^{t-1}$ to obtain a matrix $G^t$ for a next iteration t+1, wherein the accuracy condition requires that the deviation $\Delta G$ is smaller than a threshold.

* * * * *